United States Patent
Zheng et al.

(10) Patent No.: US 10,021,820 B2
(45) Date of Patent: Jul. 10, 2018

(54) APPARATUS FOR DISASSEMBLING ELECTRONIC COMPONENT FROM CIRCUIT BOARD

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Jin-Song Zheng, Shenzhen (CN); Jing-Bin Liang, Shenzhen (CN); Hai-Gui Huang, Shenzhen (CN); Jun-Xi Liu, Shenzhen (CN); Ming-Jun Yi, Shenzhen (CN); Er-Hui Guo, Shenzhen (CN); Zhou Chen, Shenzhen (CN); Xi-Qiang Hu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

(*) Notice: Subject to any disclaimer, the term of this patent is extended or adjusted under 35 U.S.C. 154(b) by 218 days.

(21) Appl. No.: 14/848,018

(22) Filed: Sep. 8, 2015

(65) Prior Publication Data
US 2016/0353622 A1 Dec. 1, 2016

(30) Foreign Application Priority Data
May 26, 2015 (CN) .......................... 2015 1 0273245

(51) Int. Cl.
*B23P 19/00* (2006.01)
*H05K 13/04* (2006.01)
*H05K 13/00* (2006.01)

(52) U.S. Cl.
CPC ..... *H05K 13/0486* (2013.01); *H05K 13/0061* (2013.01); *Y10T 29/53274* (2015.01)

(58) Field of Classification Search
CPC ................ B23K 1/018; B23K 2201/42; H05K 13/0486; H05K 3/225; H05K 2203/176; Y10T 29/53191; Y10T 29/53274; Y10T 29/49124
USPC ......... 29/762, 740, 741, 743, 764, 829, 841, 29/770
See application file for complete search history.

(56) References Cited

U.S. PATENT DOCUMENTS

| | | | | |
|---|---|---|---|---|
| 5,402,563 A * | 4/1995 | Satoh | ................. | H05K 13/0486 228/264 |
| 5,598,965 A * | 2/1997 | Scheu | .................... | B23K 1/018 228/49.5 |

* cited by examiner

*Primary Examiner* — Thiem Phan
(74) *Attorney, Agent, or Firm* — ScienBiziP, P.C.

(57) ABSTRACT

An apparatus for disassembling an electronic component from a circuit board includes a base, a controller, a positioning assembly, and a heating and suction assembly. The controller is fixed to the base. The positioning assembly is arranged on the base and coupled to the controller. The positioning assembly is configured to be controlled by the controller to position the circuit board at a first predetermined position. The heating and suction assembly is movably arranged on the base and coupled to the controller. The heating and suction assembly is moved to a second predetermined position to heat the electronic component and moved to a third predetermined position to attract and hold the heated electronic component by suction, whereby the electronic component is disassembled from the circuit board.

3 Claims, 11 Drawing Sheets

APPARATUS FOR DISASSEMBLING ELECTRONIC COMPONENT FROM CIRCUIT BOARD

CROSS-REFERENCE TO RELATED APPLICATIONS

This application claims priority to Chinese Patent Application No. 201510273245.6 filed on May 26, 2015, the contents of which are incorporated by reference herein.

FIELD

The subject matter herein generally relates to circuit board handling.

BACKGROUND

Electronic components are manually disassembled from circuit boards. A heat gun is manually employed to heat an electronic component. Then, a pair of tweezers or other instrument is manually employed to disassemble the electronic component from the circuit board.

BRIEF DESCRIPTION OF THE DRAWINGS

Implementations of the present technology will now be described, by way of example only, with reference to the attached figures, wherein.

DETAILED DESCRIPTION

Figure 1:
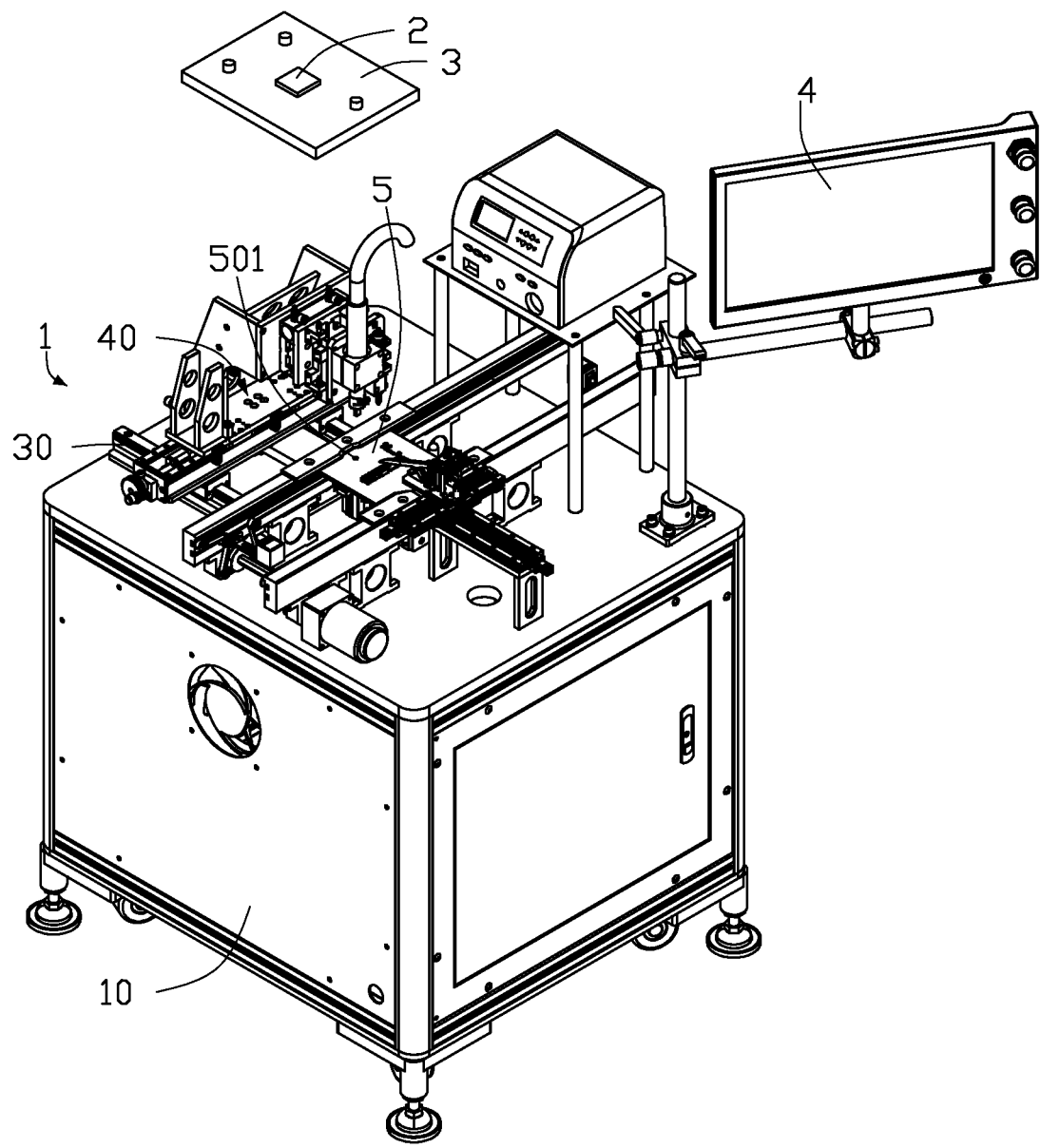
FIG. 1 is an isometric view showing an embodiment of an apparatus and a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

In general, the term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Embodiments of the present disclosure will be described with reference to the accompanying drawings.

FIG. 1 illustrates a view of an embodiment of an apparatus 1 for disassembling an electronic component 2 from a circuit board 3. The apparatus 1 can include a base 10, a controller 20 (shown in FIG. 2), a positioning assembly 30, and a heating and suction assembly 40. The controller 20 can be fixed to the base 10 and electrically coupled to the positioning assembly 30 and the heating and suction assembly 40. The controller 20 can be configured to control the positioning assembly 30 and the heating and suction assembly 40. The positioning assembly 30 can be arranged on the base 10. The positioning assembly 30 can be configured to be controlled by the controller 20 to position the circuit board 3 at a first predetermined position. The heating and suction assembly 40 can be movably arranged on the base 10. The heating and suction assembly 40 can be configured to be controlled by the controller 20 to move to a second predetermined position to heat the electronic component 2, and be controlled by the controller 20 to move to a third predetermined position to suck the electronic component 2 up, thereby the electronic component 2 is disassembled from the circuit board 3. In at least one embodiment, the first predetermined position, the second predetermined position, and the third predetermined position can be input by an input unit 4. In at least one embodiment, the first predetermined position can be different from the second predetermined position and different from the third predetermined position. The second predetermined position can be same as the third predetermined position, or different.

Figure 2:
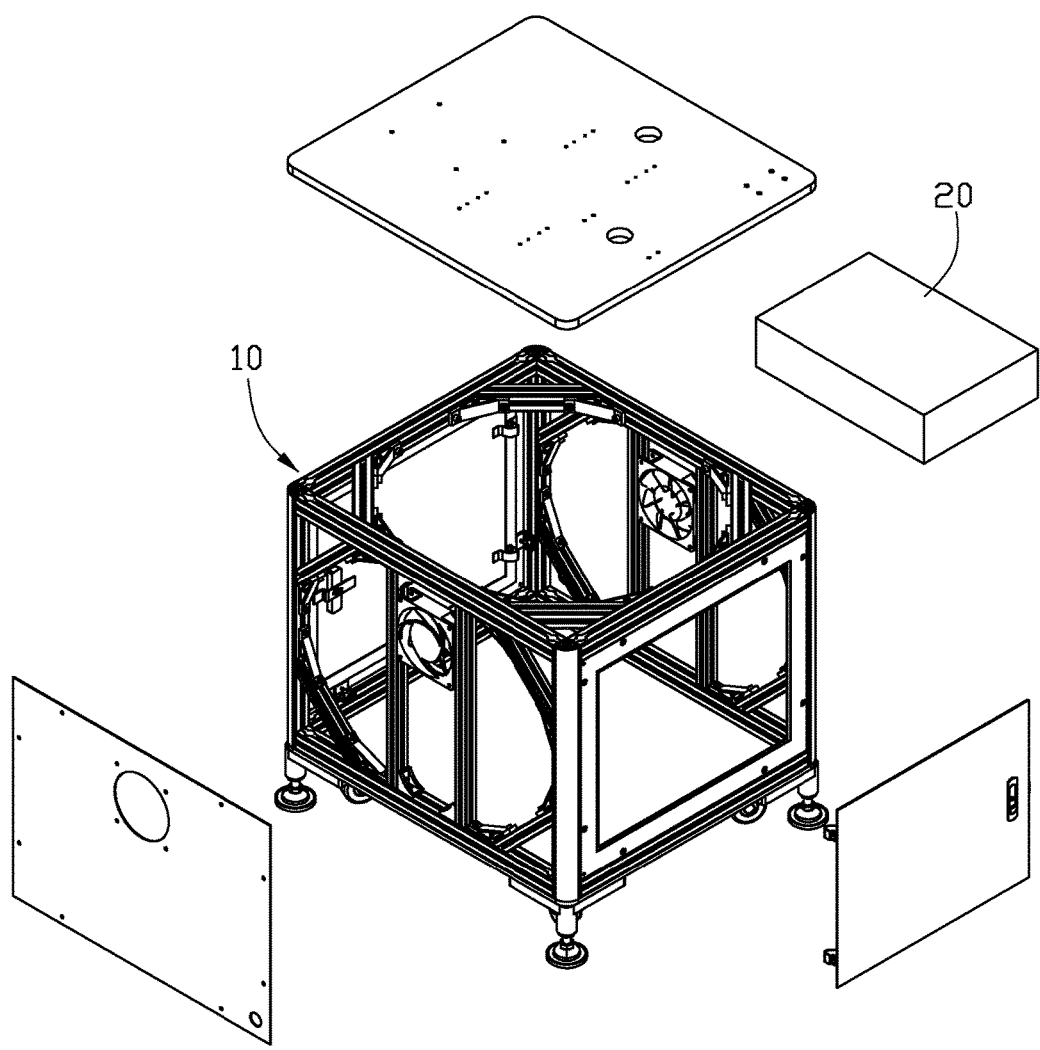
FIG. 2 is an exploded, isometric view showing an embodiment of a base of the apparatus of FIG. 1.

FIG. 2 illustrates an exploded, isometric view of a base of the apparatus 1. In at least one embodiment, the controller 20 can be fixed in the base 10. In at least one embodiment, the controller 20 can be a programmable logic controller (PLC) 20.

Figure 3:
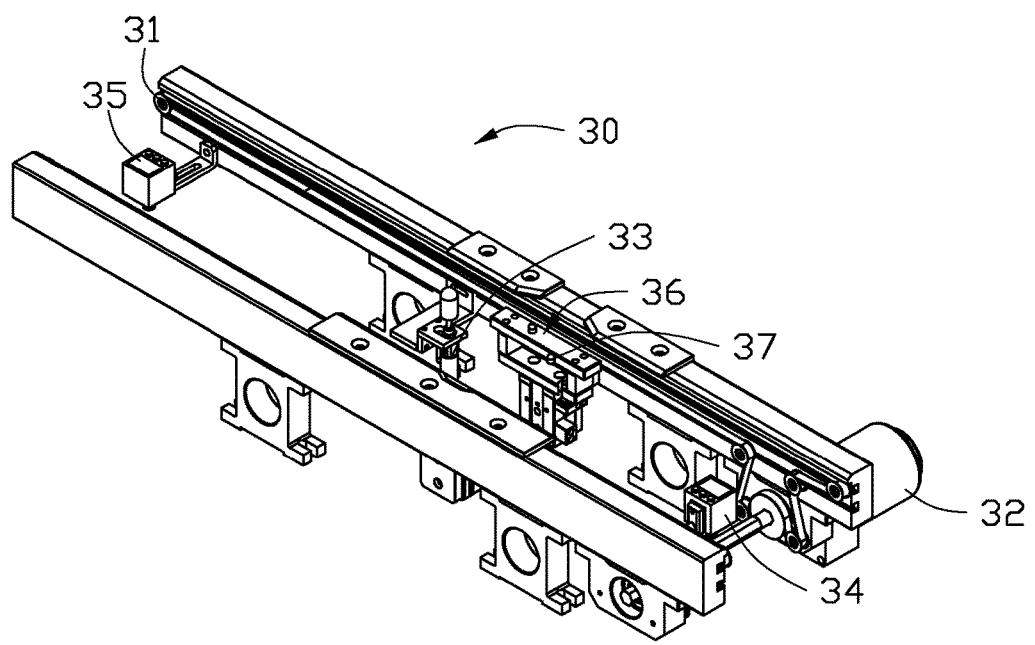
FIG. 3 is an isometric view showing an embodiment of a positioning assembly of the apparatus of FIG. 1.
Figure 4:
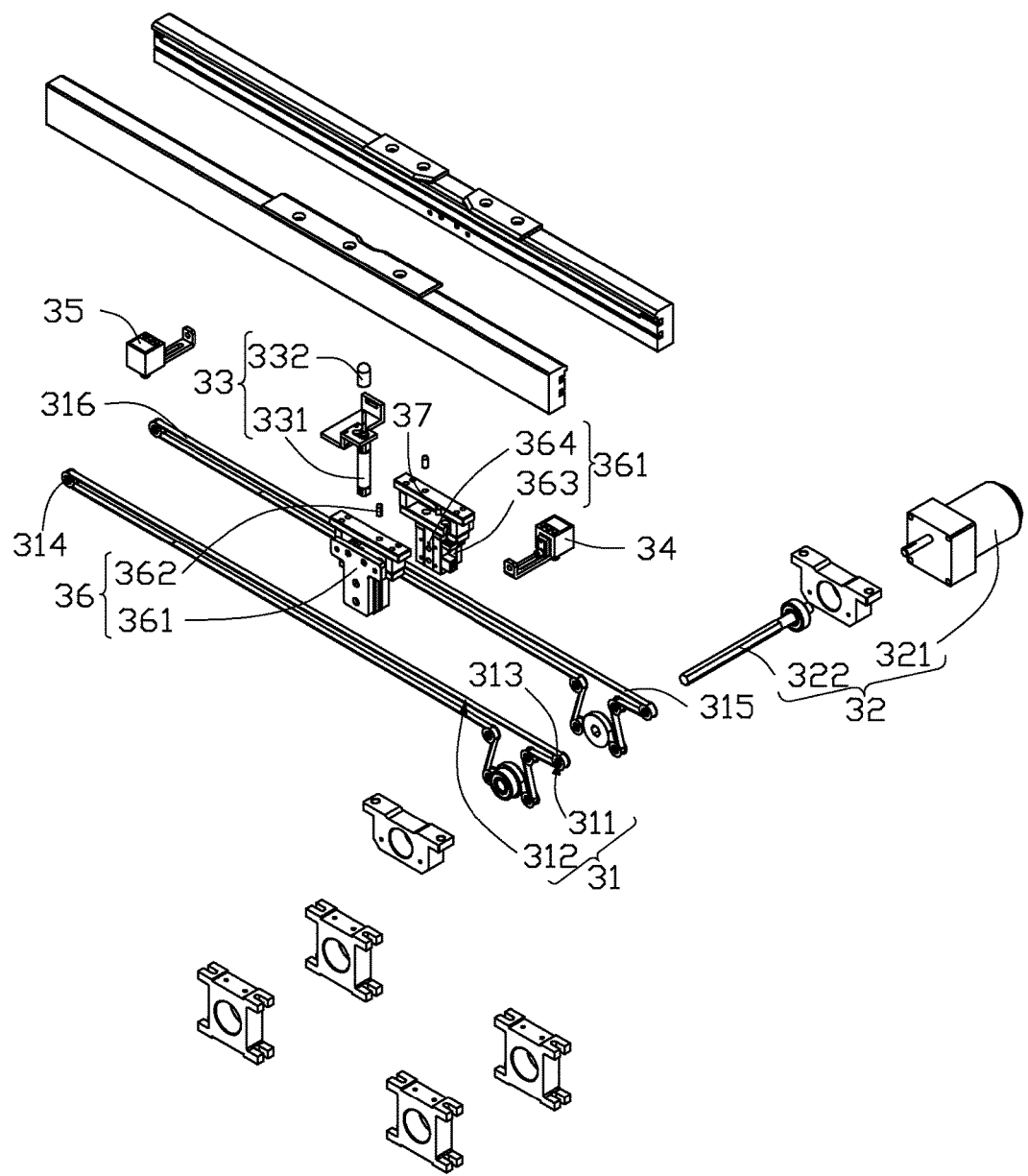
FIG. 4 is an exploded, isometric view of the positioning assembly of FIG. 3.
Figure 5:
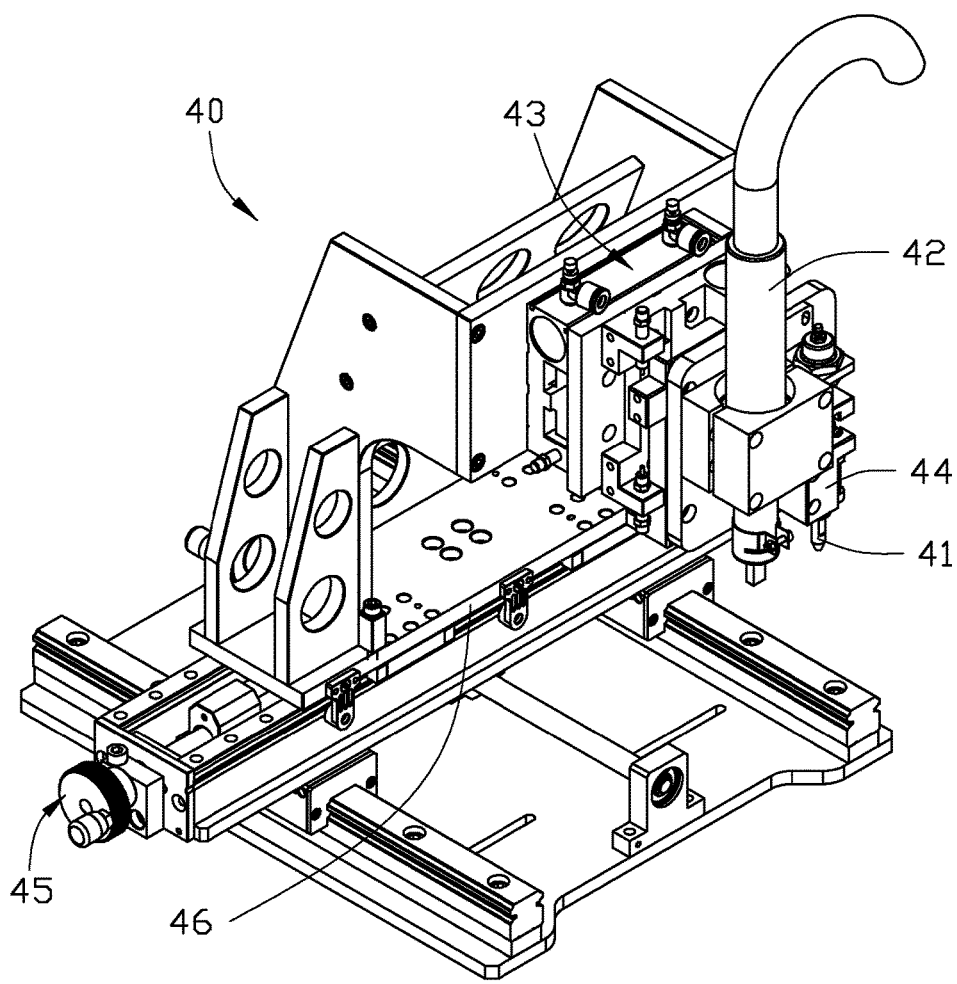
FIG. 5 is an isometric view showing an embodiment of a heating and suction assembly of the apparatus of FIG. 1.

FIGS. 3-4 illustrate an embodiment of the positioning assembly 30. In at least one embodiment, the positioning assembly 30 can include a transmission device 31, a first driving device 32, a resisting device 33, and a first sensor 34. In at least one embodiment, the transmission device 31 can include two pairs of wheels 311 and two transmission members 312. In at least one embodiment, each pair of wheels 311 can include a driving wheel 313 and a driven wheel 314. The driving wheel 313 and the driven wheel 314 in each pair can be spaced from each other and rotatably coupled to the base 10. In at least one embodiment, each transmission member 312 can be looped. In at least one embodiment, each transmission member 312 can be a strap.

Two transmission members 312 can be spaced from each other and can cooperate to support and transmit the circuit board 3. In the embodiment, the circuit board 3 can be received in a circuit board carrier 5 (shown in FIG. 1), and arranged on the transmission members 312 via the circuit board carrier 5. In at least one embodiment, the circuit board carrier 5 can define two through holes 501 (shown in FIG. 1). Each transmission member 312 can be wrapped around the driving wheel 313 and the driven wheel 314 in the corresponding pair. In at least one embodiment, the transmission members 312 can be parallel with each other. In the embodiment, each transmission member 312 can include a first end 315 and a second end 316 opposite to the first end 315. The first ends 315 of the transmission members 312 can be adjacent to the driving wheels 313 with respect to the second ends 316 of the transmission members 312, and the second ends 316 of the transmission members 312 can be adjacent to the driven wheels 314 with respect to the first ends 315 of the transmission members 312.

In at least one embodiment, the first driving device 32 can be configured to drive the transmission members 312 to transmit the circuit board 3 to the first predetermined position. The first driving device 32 can include a first driving member 321 and a first shaft 322. In at least one embodiment, the first driving member 321 can be a motor. The first driving member 321 can be coupled to the first shaft 322 and the controller 20. The first driving member 321 can be controlled by the controller 20 to drive the first shaft 322 to rotate. In at least one embodiment, the first shaft 322 can be coupled to the driving wheels 313. The first shaft 322 can be configured to rotate the driving wheels 313, thus the transmission members 312 can rotate with the driven wheels 314 to bring the circuit board 3 to the first predetermined position.

In at least one embodiment, the resisting device 33 can be arranged between the transmission members 312 and be at the first predetermined position. The resisting device 33 can move away from the base 10 to block a movement of the circuit board 3. In at least one embodiment, the resisting device 33 can move toward the base 10 to permit a passing of the circuit board 3. In at least one embodiment, the resisting device 33 can be a first air cylinder. The resisting device 33 can include a first cylinder block 331 and a first cylinder rod 332. The first cylinder block 331 can be fixed between the transmission members 312. The first cylinder rod 332 can be movably arranged between the transmission members 312. The first cylinder rod 332 can be extended by the first cylinder block 331 away from the base 10 or can be retracted by the first cylinder block 331 toward the base 10, thus the resisting device 33 moves away from or moves toward the base 10.

In at least one embodiment, the first sensor 34 can be fixed between the transmission members 312 and be adjacent to the first ends 315 of the transmission members 312 with respect to the resisting device 33. The first sensor 34 can be configured to sense the circuit board 3. The first sensor 34 can generate a first sensing signal to the controller 20 when sensing the circuit board 3, thereby the controller 20 can control the first driving member 321 to drive the first shaft 322 to rotate and control the resisting device 33 to move away from the base 10.

FIGS. 5-9 illustrate an embodiment of the heating and suction assembly 40. In at least one embodiment, the heating and suction assembly 40 can be arranged on one side of the transmission members 312. In at least one embodiment, the heating and suction assembly 40 can be arranged on a left side of the transmission members 312. The heating and suction assembly 40 can include a vacuum suction nozzle 41, a heat gun 42, and a second driving device 43. In the embodiment, the vacuum suction nozzle 41 can be configured to attract and hold the electronic component 2 by suction or blow out air to disengage the electronic component 2.

In at least one embodiment, the heat gun 42 can be configured to blow hot air.

In at least one embodiment, the second driving device 43 can be configured to drive the heat gun 42 to move from a first initial position to the second predetermined position, and drive the vacuum suction nozzle 41 to move from a second initial position to the third predetermined position. In at least one embodiment, the first initial position and the second initial position can be input by the input unit 4. The second driving device 43 can include a second driving member 431 and a third driving member 432. The second driving member 431 can be coupled to the vacuum suction nozzle 41 and the heat gun 42. The second driving member 431 can be further coupled to the controller 20. The second driving member 431 can be configured to drive the vacuum suction nozzle 41 and the heat gun 42 toward or away from the base 10. In at least one embodiment, the second driving member 431 can be a second air cylinder. The second driving member 431 can include a second cylinder block 433 and a second cylinder rod 434. The second cylinder block 433 can be coupled to the third driving member 432. The second cylinder rod 434 can be fixed to the vacuum suction nozzle 41 and the heat gun 42. The second cylinder rod 434 can be extended or retracted by the second cylinder block 433 to drive the vacuum suction nozzle 41 and the heat gun 42 toward or away from the base 10, thus the second driving member 431 drives the vacuum suction nozzle 41 and the heat gun 42 toward or away from the base 10. The third driving member 432 can be arranged on the base 10 and be coupled to the second driving member 431. The third driving member 432 can be further coupled to the controller 20. The third driving member 432 can be configured to drive the second driving member 431 to move the vacuum suction nozzle 41 and the heat gun 42 in a direction parallel with the transmission members 312. In at least one embodiment, the third driving member 432 can be a third air cylinder. The third driving member 432 can include a third cylinder block 435 and a third cylinder rod 436. The third cylinder block 435 can be coupled to the base 10. The third cylinder rod 436 can be fixed to the second cylinder block 433. The third cylinder rod 436 can be extended or retracted by the third cylinder block 435 to drive the second driving member 431 to move the vacuum suction nozzle 41 and the heat gun 42 in the direction parallel with the transmission members 312, thus the third driving member 432 can drive the second driving member 431 to move the vacuum suction nozzle 41 and the heat gun 42 in the direction parallel with the transmission members 312.

To disassemble the electronic component 2, the circuit board carrier 5 which receives the circuit board 3 can be arranged on the transmission members 312. The first sensor 34 can sense the presence of the circuit board 3 and generate the first sensing signal to the controller 20, whereby the controller 20 can control the first driving member 321 to rotate the first shaft 322, and control the resisting device 33 to move away from the base 10. The first shaft 322 can rotate the driving wheels 313, whereby the transmission members 312 rotates with the driven wheels 314 to bring the circuit board 3 toward the resisting device 33, until blocked by the resisting device 33. The second driving member 431 and the third driving member 432 can be controlled by the controller 20 to cooperatively drive the heat gun 42 to the second predetermined position. The controller 20 can control the heat gun 42 to blow hot air and record the period of blowing time of the heat gun 42 when the heat gun 42 is at the second predetermined position. The controller 20 can further control the second driving member 431 and the third driving member 432 to cooperatively drive the vacuum suction nozzle 41 to the third predetermined position when the period of blowing time of the heat gun 42 reaches a first predetermined time (such as 120 seconds), and control the vacuum suction nozzle 41 to apply suction to the electronic component 2 when the vacuum suction nozzle 41 is at the third predetermined position.

In at least one embodiment, the controller 20 can further govern the period of suction time of the vacuum suction nozzle 41, and control the second driving member 431 and the third driving member 432 to drive the vacuum suction nozzle 41 to a fourth predetermined position when the period of suction time reaches a second predetermined time (such as 9 seconds). The controller 20 can further control the vacuum suction nozzle 41 to blow out air when the vacuum suction nozzle 41 is at the fourth predetermined position, thus the electronic component 2 is disengaged from the vacuum suction nozzle 41, whereby the electronic component 2 can be retrieved.

In at least one embodiment, the controller 20 can further control and measure the period of blowing time of the vacuum suction nozzle 41, and control the second driving member 431 and the third driving member 432 to drive the heat gun 42 to the first initial position and drive the vacuum suction nozzle 41 to the second initial position when the period of blowing time of the vacuum suction nozzle 41 reaches a third predetermined time (such as 6 seconds).

In at least one embodiment, the positioning assembly 30 can further include a second sensor 35 (shown in FIGS. 3-4). The second sensor 35 can be fixed between the transmission members 312 and be adjacent to the second ends 316 of the transmission members 312 with respect to the resisting device 33. The second sensor 35 can be configured to sense the circuit board 3. The second sensor 35 can generate a second sensing signal to the controller 20 when sensing the presence of the circuit board 3, thus the controller 20 can control the first driving member 321 to stop driving the first shaft 322 according to the second sensing signal.

In at least one embodiment, the positioning assembly 30 can further include a pair of positioning devices 36 (shown in FIGS. 3-4). The pair of positioning devices 36 can be arranged between the transmission members 312 and arranged between the first sensor 34 and the resisting device 33. In at least one embodiment, each positioning device 36 can include a driving device 361 and a limiting member 362. The driving device 361 can be coupled to the controller 20 and the limiting member 362. The driving devices 361 can be configured to drive the limiting members 362 away from the base 10, to enter into the through holes 501 of the circuit board carrier 5, thus the circuit board 3 can be positioned. In at least one embodiment, the driving devices 361 can be configured to drive the limiting members 362 toward the base 10 to disengage from the through holes 501 of the circuit board carrier 5, thus the circuit board 3 can pass by the resisting device 33. In at least one embodiment, each driving device 361 can be a fourth air cylinder. Each driving device 361 can include a fourth cylinder block 363 and a fourth cylinder rod 364. Each fourth cylinder block 363 can be fixed between the transmission members 312. Each fourth cylinder rod 364 can be fixed to a corresponding limiting member 362. The fourth cylinder rods 364 can be extended or retracted by the fourth cylinder blocks 363 to drive the limiting members 362 away from or toward the base 10, thus the driving devices 361 can drive the limiting members 362 away from or toward the base 10.

In at least one embodiment, the positioning assembly 30 can include a detection unit 37 (shown in FIGS. 3-4). In at least one embodiment, the detection unit 37 can be a sensor. The detection unit 37 can be fixed to the pair of positioning devices 36. The detection unit 37 can be configured to sense the presence of the circuit board 3. The detection unit 37 can generate a detection signal to the controller 20 when sensing the circuit board 3. The controller 20 can control the driving devices 361 to drive the limiting members 362 away from the base 10 and control the resisting device 33 toward the base 10 when the controller 20 receives the detection signal for a predetermined time period.

In at least one embodiment, the controller 20 can further control the driving devices 361 to drive the limiting members 362 toward the base 10 when the period of suction time of the vacuum suction nozzle 41 reaches the second predetermined time (such as 9 seconds).

Figure 8:
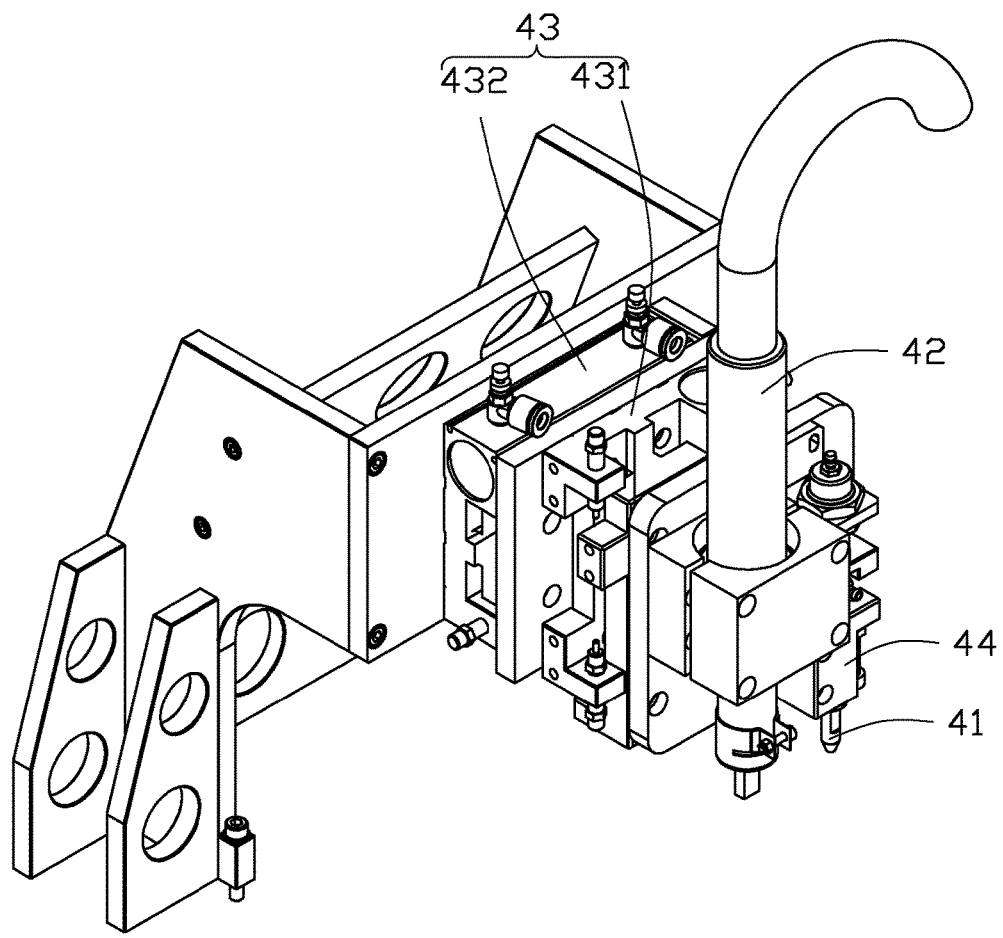
FIG. 8 is an isometric view showing an embodiment of a heating and sucking device of the heating and suction assembly of FIG. 5.
Figure 9:
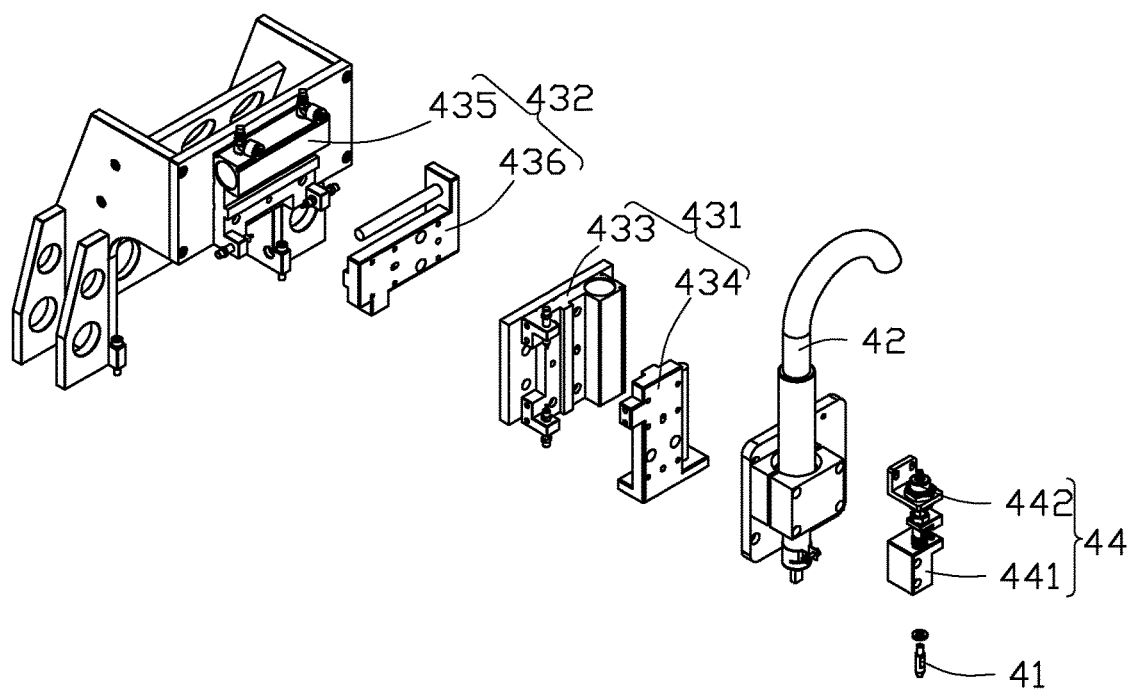
FIG. 9 is an exploded, isometric view of the heating and sucking device of FIG. 8.

In at least one embodiment, the heating and suction assembly 40 can further include a third driving device 44 (shown in FIGS. 8-9). The third driving device 44 can cooperate with the second driving device 43 to drive the vacuum suction nozzle 41 to move from the second initial position to the third predetermined position. In at least one embodiment, the second driving member 431 can be coupled to the vacuum suction nozzle 41 via the third driving device 44. The third driving device 44 can be configured to drive the vacuum suction nozzle 41 toward or away from the base 10. In at least one embodiment, the third driving device 44 can be an air cylinder. The third driving device 44 can include a fifth cylinder block 441 and a fifth cylinder rod 442. The fifth cylinder rod 442 can be fixed to the second driving device 43. The fifth cylinder block 441 can be fixed to the vacuum suction nozzle 41. The fifth cylinder rod 442 can be extended or retracted by the fifth cylinder block 441 to drive the vacuum suction nozzle 41 toward or away from the base 10, thus the third driving device 44 can drive the vacuum suction nozzle 41 toward or away from the base 10.

Figure 6:
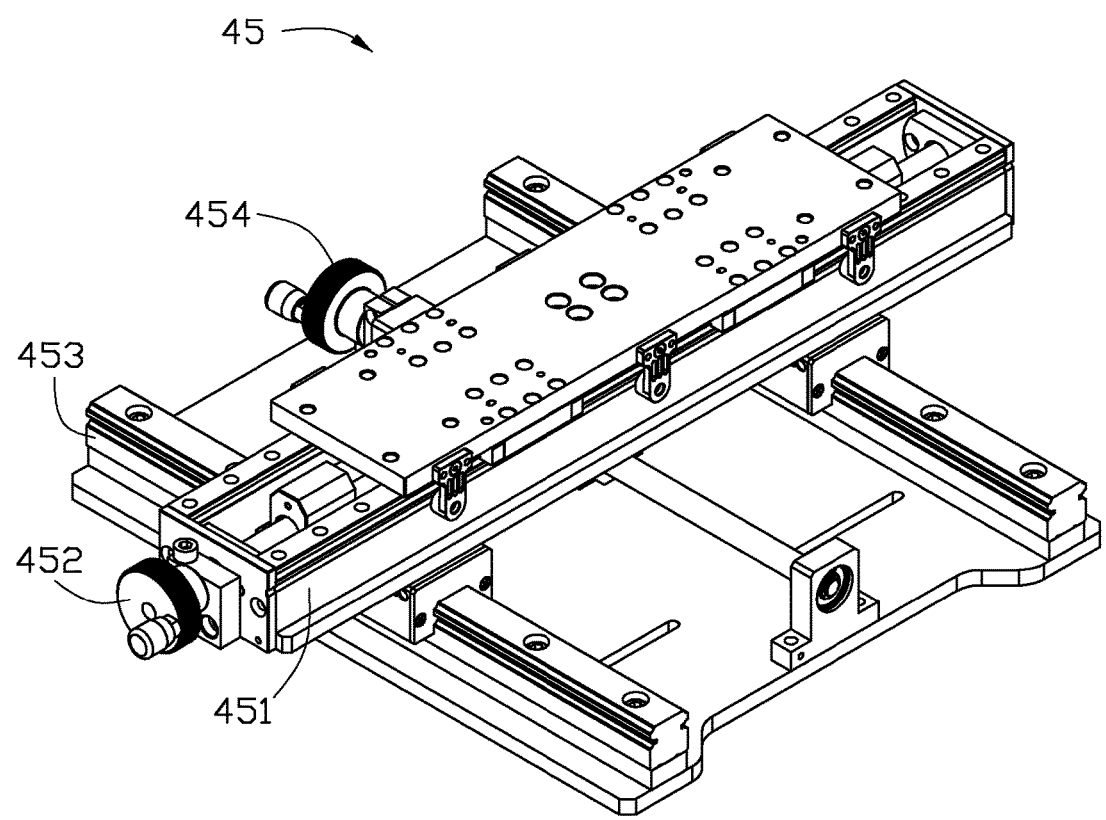
FIG. 6 is an isometric view showing an embodiment of an adjusting device of the heating and suction assembly of FIG. 5.
Figure 7:
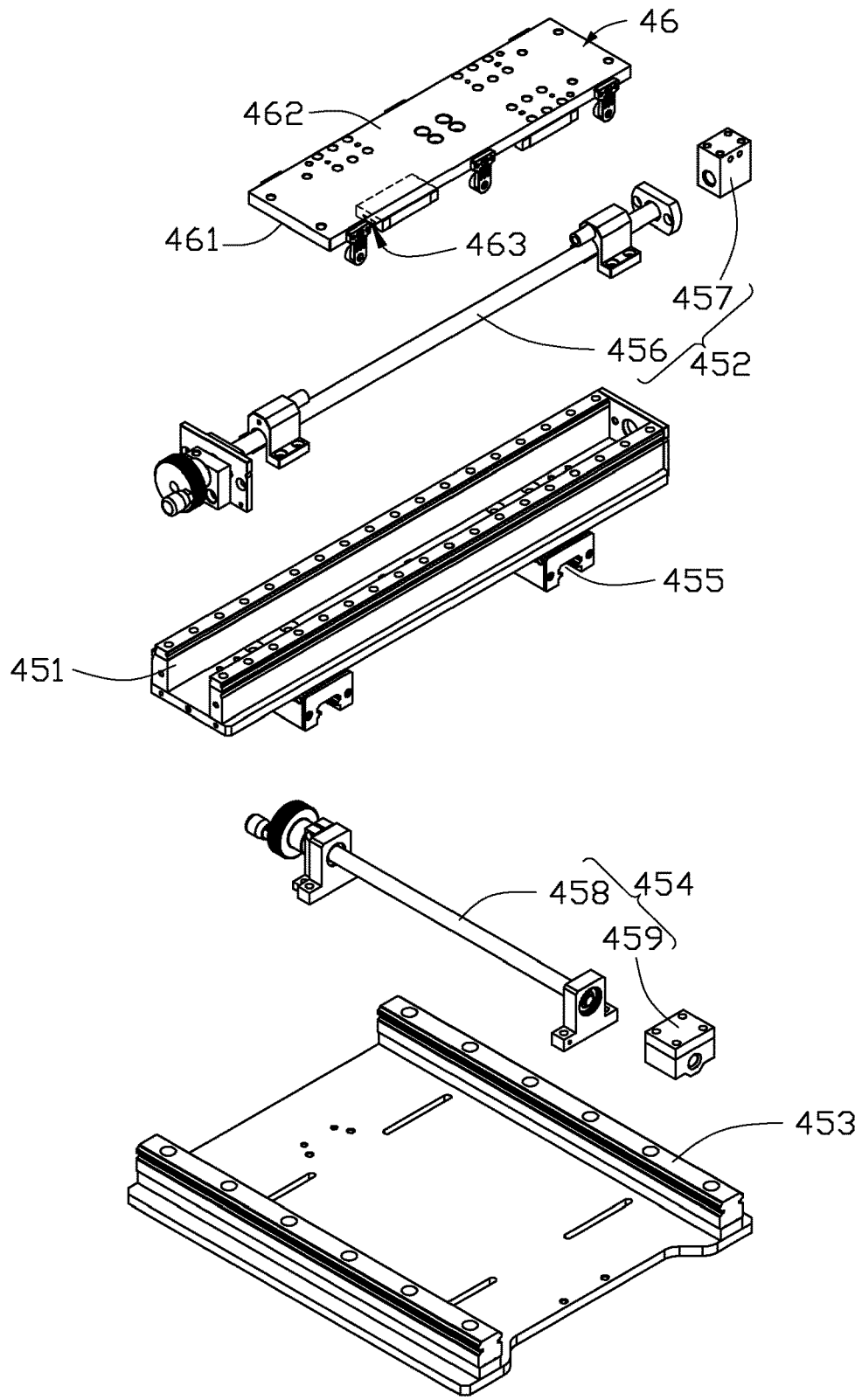
FIG. 7 is an exploded, isometric view of the adjusting device of FIG. 6.

In at least one embodiment, the heating and suction assembly 40 can include an adjusting device 45 (shown in FIGS. 6-7). In at least one embodiment, the adjusting device 45 can include a first pair of guides 451, a first adjusting member 452, a second pair of guides 453, and a second adjusting member 454. The guides 451 in the first pair can be spaced from each other. A bottom of each guide 451 in the first pair can define two first receiving grooves 455 to receive the guides 453 in the second pair, thus the first pair of guides 451 can be slidably coupled to the second pair of guides 453. In at least one embodiment, the first adjusting member 452 can include a first threaded rod 456 and a first sliding block 457. The first threaded rod 456 can be rotatably coupled to the first pair of guides 451 and arranged between the guides 451 in the first pair. The first threaded rod 456 can be configured to be operated to rotate by user operation. The first sliding block 457 can be fixed to the third driving member 432 and slidably screwed to the first threaded rod 456. The first sliding block 457 can be configured to be brought by the first threaded rod 456 to move in the direction parallel with the transmission members 312, thus the heat gun 42 and the vacuum suction nozzle 41 can be moved by the first sliding block 457 in the direction parallel with the transmission members 312. In at least one embodiment, the second pair of guides 453 can be fixed to the base 10. In at least one embodiment, the second pair of guides 453 can be substantially perpendicular to the first pair of guides 451. The guides 453 in the second pair can be spaced from each other. In at least one embodiment, the second adjusting member 454 can include a second threaded rod 458 and a second sliding block 459. The second threaded rod 458 can be rotatably coupled to the base 10 and arranged between the guides 453 in the second pair. The second threaded rod 458 can be configured to be operated to rotate by user operation. The second sliding block 459 can be fixed to the first pair of guides 451 and slidably screwed to the second threaded rod 458. The second sliding block 459 can be configured to be brought by the second threaded rod 458 toward or away from the transmission members 312, thus the heat gun 42 and the vacuum suction nozzle 41 can be brought by the second sliding block 459 to move toward or away from the transmission members 312.

In at least one embodiment, the heating and suction assembly 40 can further include a main body 46 (shown in FIGS. 6-7). The main body 46 can be fixed to the second sliding block 459 and the third driving member 432. The main body 46 can include a first surface 461 and a second surface 462 opposite to the first surface 461. In at least one embodiment, the first surface 461 of the main body 46 can be a lower surface of the main body 46 and the second surface 462 of the main body 46 can be an upper surface of the main body 46. The main body 46 can define at least one second receiving groove 463 extending from the first surface 461 of the main body 46 to the second surface 462 of the main body 46. In at least one embodiment, two second receiving grooves 463 can be taken as an example. The second receiving grooves 463 can be configured to receive the guides 453 in the second pair. Thus, the base 10 can be slidably coupled to the second pair of guides 453. The second sliding block 459 can be fixed to the first surface 461 of the main body 46, and the third driving member 432 can be fixed to the second surface 462 of the main body 46.

Figure 10:
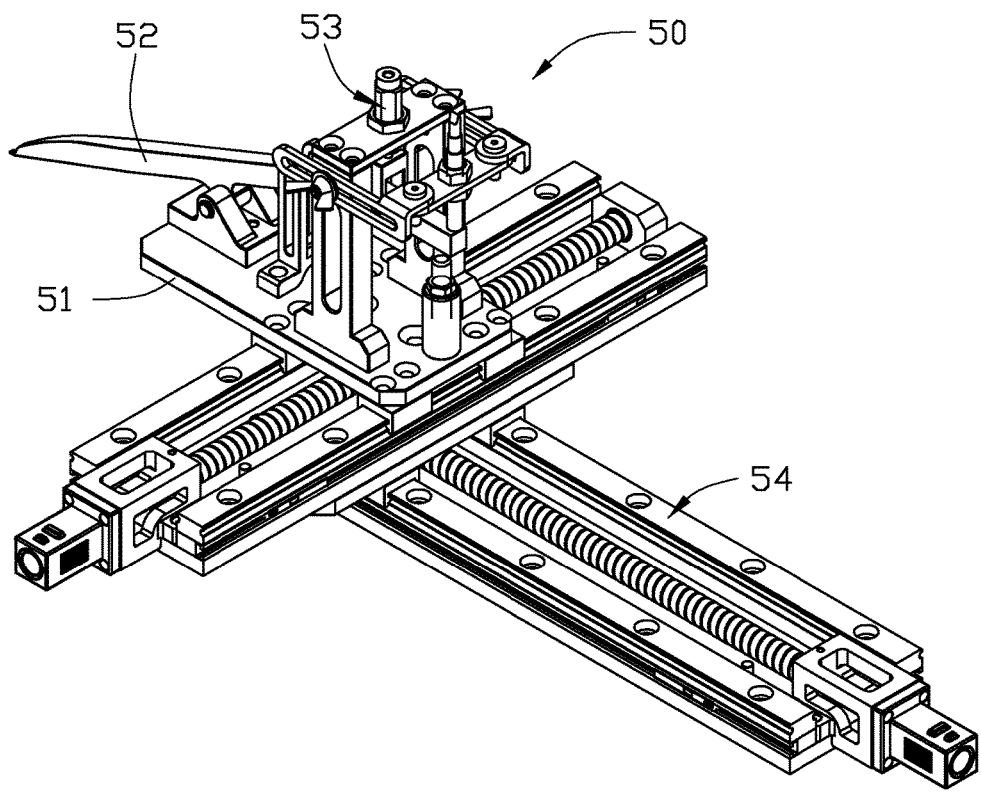
FIG. 10 is an isometric view showing an embodiment of a disassembling assembly of the apparatus of FIG. 1.
Figure 11:
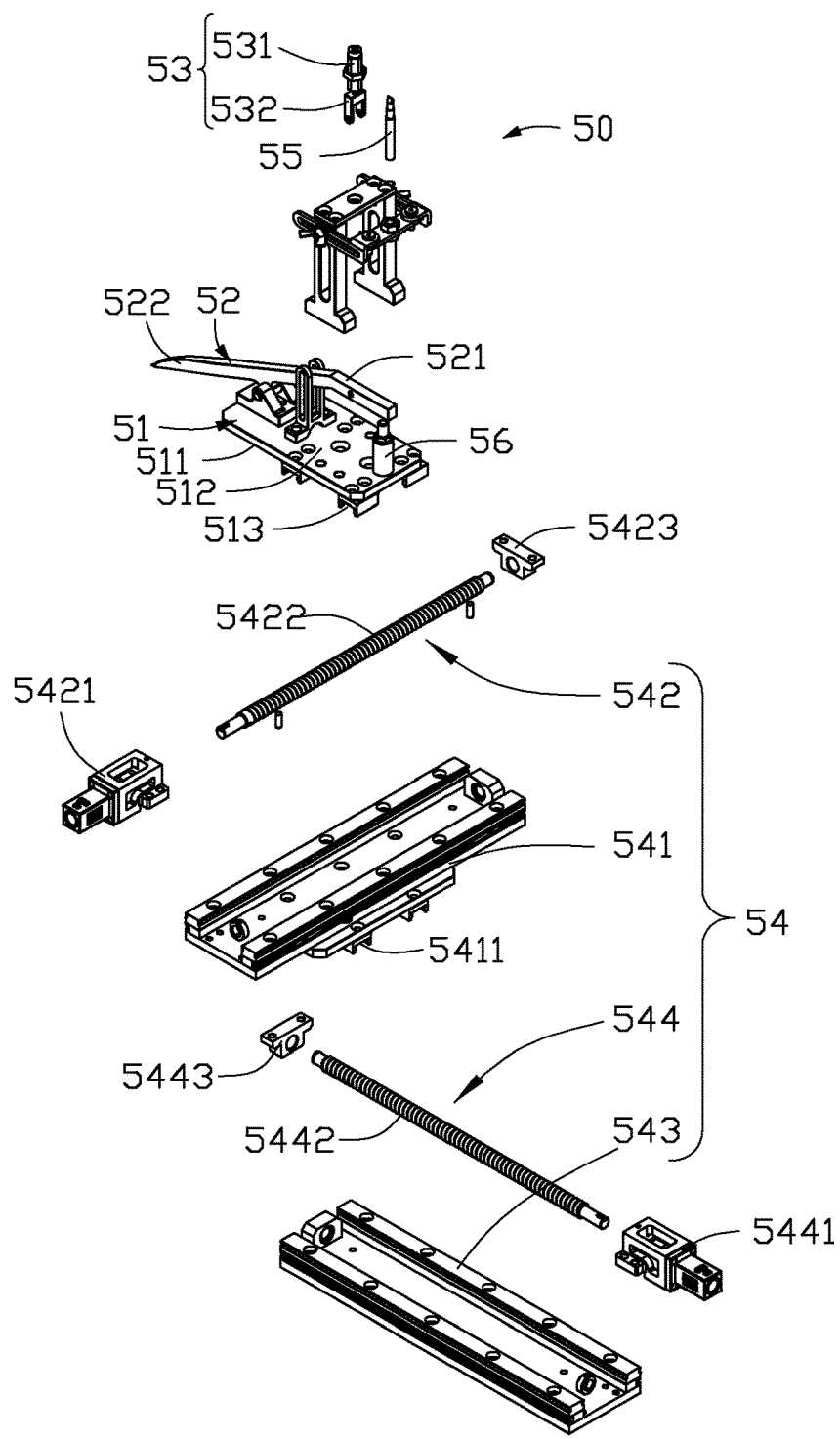
FIG. 11 is an exploded, isometric view of the disassembling assembly of FIG. 10.

In at least one embodiment, the apparatus 1 can further include a disassembling assembly 50. FIGS. 10-11 illustrate an embodiment of the disassembling assembly 50. The disassembling assembly 50 and the heating and suction assembly 40 can be arranged at opposite sides of the transmission members 312. In at least one embodiment, the disassembling assembly 50 can be arranged on a right hand side of the transmission members 312. The disassembling assembly 50 can be coupled to the controller 20. In at least one embodiment, the disassembling assembly 50 can include a splitting knife carrier 51, a splitting knife 52, a pressing device 53, and a fourth driving device 54. In at least one embodiment, the splitting knife carrier 51 can include a first surface 511 and a second surface 512 opposite to the first surface 511. In the embodiment, the first surface 511 of the splitting knife carrier 51 can be a lower surface of the splitting knife carrier 51 and the second surface 512 of the splitting knife carrier 51 can be an upper surface of the splitting knife carrier 51. The splitting knife carrier 51 can define at least one third receiving groove 513 extending from the first surface 511 of the splitting knife carrier 51 to the second surface 512 of the splitting knife carrier 51. In at least one embodiment, two third receiving grooves 513 can be taken as an example.

In at least one embodiment, the splitting knife 52 can be rotatably coupled to the second surface 512 of the splitting knife carrier 51. The splitting knife 52 can be configured to lever up and disengage the electronic component 2 from the circuit board 3. The splitting knife 52 can include a first end 521 and a second end 522 opposite to the first end 521.

In at least one embodiment, the pressing device 53 can be coupled to the controller 20 and the second surface 512 of the splitting knife carrier 51. The pressing device 53 can be fixed to the first end 521 of the splitting knife 52. The pressing device 53 can be configured to drive the first end 521 of the splitting knife 52 toward the splitting knife carrier 51, causing the splitting knife 52 to rotate with respect to the splitting knife carrier 51, thus the second end 522 of the splitting knife 52 can move away from the splitting knife carrier 51. In at least one embodiment, the controller 20 can control the pressing device 53 to drive the first end 521 of the splitting knife 52 toward the splitting knife carrier 51 when the period of blowing time of the heat gun 42 reaches the first predetermined time (such as 120 seconds).

In at least one embodiment, the pressing device 53 can be an air cylinder. The pressing device 53 can include a sixth cylinder block 531 and a sixth cylinder rod 532. The sixth cylinder block 531 can be fixed to the splitting knife carrier 51. The sixth cylinder rod 532 can be fixed to the first end 521 of the splitting knife 52. The sixth cylinder rod 532 can be driven by the sixth cylinder block 531 to bring the first end 521 of the splitting knife 52 toward or away from the splitting knife carrier 51, thus the pressing device 53 can drive the first end 521 of the splitting knife 52 toward or away from the splitting knife carrier 51.

In at least one embodiment, the fourth driving device 54 can be arranged on the base 10. The fourth driving device 54 can be coupled to the splitting knife carrier 51 and the controller 20. The fourth driving device 54 can be configured to drive the splitting knife 52 to the fourth predetermined position. In at least one embodiment, the fourth predetermined position can be input via the input unit 4. The fourth driving device 54 can include a third pair of guides 541, a third adjusting member 542, a fourth pair of guides 543, and a fourth adjusting member 544. Each guide 541 in the third pair can be received in a corresponding third receiving groove 513, thus the splitting knife carrier 51 can be slidably coupled to the third pair of guides 541. A bottom of each guide 541 in the third pair can define at least one fourth receiving groove 5411. In at least one embodiment, two fourth receiving grooves 5411 can be taken as an example. The fourth receiving grooves 5411 can be configured to receive the guides 543 in the fourth pair, thus the third pair of guides 541 can be slidably coupled to the fourth pair of guides 543. In at least one embodiment, the guides 541 in the third pair can be spaced from each other.

The third adjusting member 542 can be arranged between the guides 541 in the third pair. In at least one embodiment, the third adjusting member 542 can include a fourth driving member 5421, a third threaded rod 5422, and a third sliding block 5423. The fourth driving member 5421 can be fixed to the third pair of guides 541 and coupled to the controller 20. The fourth driving member 5421 can be controlled by the controller 20. In at least one embodiment, the fourth driving member 5421 can be a motor. The third threaded rod 5422 can be rotatably coupled to the third pair of guides 541 and fixed to the fourth driving member 5421. In at least one embodiment, the third threaded rod 5422 can be arranged between the guides 541 in the third pair. With respect to the third pair of guides 541, the third threaded rod 5422 can be driven to rotate by the fourth driving member 5421. The third sliding block 5423 can be slidably screwed to the third threaded rod 5422 and fixed to the splitting knife carrier 51. The third sliding block 5423 can be moved by the third threaded rod 5422 in the direction parallel with the transmission members 312, causing the splitting knife 52 on the splitting knife carrier 51 to move in the direction parallel with the transmission members 312.

In at least one embodiment, the fourth pair of guides 543 can be fixed to the base 10 and substantially perpendicular to the third pair of guides 541. The guides 543 in the fourth pair can be spaced from each other.

In at least one embodiment, the fourth adjusting member 544 can be arranged between the guides 543 in the fourth pair. In at least one embodiment, the fourth adjusting member 544 can include a fifth driving member 5441, a fourth threaded rod 5442, and a fourth sliding block 5443. The fifth driving member 5441 can be fixed to the base 10 and coupled to the controller 20. The fifth driving member 5441 can be configured to be controlled by the controller 20. In at least one embodiment, the fifth driving member 5441 can be a motor. The fourth threaded rod 5442 can be rotatably coupled to the base 10 and fixed to the fifth driving member 5441. In at least one embodiment, the fourth threaded rod 5442 can be arranged between the guides 543 in the fourth pair. The fourth threaded rod 5442 can be configured to be driven by the fifth driving member 5441, to rotate with respect to the base 10. The fourth sliding block 5443 can be slidably screwed to the fourth threaded rod 5442 and fixed to the third pair of guides 541. The fourth sliding block 5443 can be configured to be moved by the fourth threaded rod 5442 toward or away from the transmission members 312, causing the splitting knife 52 on the splitting knife carrier 51 to move toward or away from the transmission members 312.

In at least one embodiment, the controller 20 can control the fourth driving member 5421 and the fifth driving member 5441 to cooperatively drive the splitting knife 52 to a temporary position, from a third initial position, upon the detection signal. The controller 20 can further control the pressing device 53 to drive the first end 521 of the splitting knife 52 away from the splitting knife carrier 51 upon receiving the detection signal, causing the second end 522 of the splitting knife 52 to move toward the splitting knife carrier 51. In at least one embodiment, the third initial position and the temporary position can be input via the input unit 4.

In at least one embodiment, the controller 20 can control the fourth driving member 5421 and the fifth driving member 5441 to cooperatively drive the splitting knife 52 to the fourth predetermined position from the temporary position, so as to insert into a bottom of the electronic component 2, when the period of blowing time of the heat gun 42 reaches a fourth predetermined time (such as 110 seconds).

In at least one embodiment, the controller 20 can further control the fourth driving member 5421 and the fifth driving member 5441 to cooperatively drive the splitting knife 52 to the third initial position when the heat gun 42 and the vacuum suction nozzle 41 are respectively at the first initial position and the second initial position.

In at least one embodiment, the disassembling assembly 50 can further include a proximity sensor 55. The proximity sensor 55 can be fixed to the splitting knife carrier 51 and coupled to the controller 20. The proximity sensor 55 can be configured to sense a distance between the first end 521 of the splitting knife 52 and the splitting knife carrier 51. The controller 20 can further control the second driving member 431 and the third driving member 432 to cooperatively drive the heat gun 42 to the second predetermined position when the distance between the first end 521 of the splitting knife 52 and the splitting knife carrier 51 is at a preset value (such as 8 centimeters).

In at least one embodiment, the disassembling assembly 50 can further include a buffer 56. The buffer 56 can be fixed to the splitting knife carrier 51 and arranged between the first end 521 of the splitting knife 52 and the splitting knife carrier 51. The buffer 56 can be configured to limit a distance of movement of the first end 521 of the splitting knife 52 toward the splitting knife carrier 51 to within a preset distance range (such as 9 or 10 centimeters).

The embodiments shown and described above are only examples. Even though numerous characteristics and advantages of the present technology have been set forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims.

What is claimed is:

1. An apparatus for disassembling an electronic component from a circuit board, comprising:
   a base;
   a controller fixed to the base;
   a positioning assembly arranged on the base and coupled to the controller, the positioning assembly being configured to be controlled by the controller to position the circuit board at a first predetermined position; and
   a heating and suction assembly movably arranged on the base and coupled to the controller, the heating and suction assembly being configured to be controlled by the controller to move to a second predetermined position to heat the electronic component and be controlled by the controller to move to a third predetermined position to attract and hold the electronic component by suction, whereby the electronic component is disassembled from the circuit board;
   wherein the apparatus further comprises a disassembling assembly:
      the disassembling assembly and the heating and suction assembly are arranged at opposite sides of the positioning assembly, the disassembling assembly is coupled to the controller, the disassembling assembly is configured to be controlled by the controller to the fourth predetermined position to disassemble the electronic component from the circuit board;
      the disassembling assembly comprises a splitting knife carrier, a splitting knife, a pressing device, and a fourth driving device;
      the splitting knife is rotatably coupled to the splitting knife carrier, the splitting knife is configured to lever up and disengage the electronic component from the circuit board, the splitting knife comprises a first end and a second end opposite to the first end;
      the pressing device is coupled to the controller and the splitting knife carrier, the pressing device is fixed to the first end of the splitting knife, the pressing device is configured to be controlled by the controller to drive the first end of the splitting knife toward the splitting knife carrier, whereby the second end of the splitting knife moves away from the splitting knife carrier; and
      the fourth driving device is arranged on the base, the fourth driving device is coupled to the splitting knife carrier and the controller, the fourth driving device is configured to be controlled by the controller to drive the splitting knife to the fourth predetermined position.

2. The apparatus as described in claim 1, wherein:
the disassembling assembly further comprises a proximity sensor, the proximity sensor is fixed to the splitting knife carrier and coupled to the controller, the proximity sensor is configured to sense a distance between the first end of the splitting knife and the splitting knife carrier;
wherein the controller is further configured to control the second driving member and the third driving member to cooperatively drive the heat gun to the second predetermined position when the distance between the first end of the splitting knife and the splitting knife carrier is at a preset value.

3. The apparatus as described in claim 1, wherein:
the disassembling assembly further comprises a buffer, the buffer is fixed to the splitting knife carrier and arranged between the first end of the splitting knife and the splitting knife carrier, the buffer is configured to limit a distance of movement of the first end of the splitting knife toward the splitting knife carrier to within a preset distance range.

* * * * *